United States Patent [19]

Aso

[11] Patent Number: 4,841,352
[45] Date of Patent: Jun. 20, 1989

[54] SEMI-CUSTOM INTEGRATED CIRCUIT PROVIDED WITH STANDARDIZED CAPACITOR CELLS

[75] Inventor: Akira Aso, Tokyo, Japan
[73] Assignee: NEC Corporation, Tokyo, Japan
[21] Appl. No.: 206,996
[22] Filed: Jun. 14, 1988

Related U.S. Application Data

[63] Continuation of Ser. No. 929,769, Nov. 13, 1986, abandoned.

[30] Foreign Application Priority Data

Nov. 13, 1985 [JP] Japan .................. 60-255254

[51] Int. Cl.⁴ .................. H01L 27/10; H01L 27/02; H01L 29/72
[52] U.S. Cl. .................. 357/45; 357/34; 357/35; 357/40; 357/51; 357/54; 357/92
[58] Field of Search ............ 357/51, 45, 45 M, 23.6, 357/34, 35, 40, 54, 92

[56] References Cited

U.S. PATENT DOCUMENTS

| 4,377,029 | 3/1983 | Ozawa ........................... 357/34 |
| 4,516,312 | 5/1985 | Tomita ........................ 357/23.6 |
| 4,626,881 | 12/1986 | Kishi et al. .................... 357/51 |

FOREIGN PATENT DOCUMENTS

| 59-181643 | 10/1984 | Japan ................ 357/45 M |
| 59-211246 | 11/1984 | Japan ................ 357/45 M |
| 60-22336 | 2/1985 | Japan ................ 357/45 M |
| 60-34036 | 2/1985 | Japan ................ 357/45 M |
| 60-66446 | 4/1985 | Japan ................ 357/45 M |

OTHER PUBLICATIONS

Takashi Saigo, "A Triple-Level Wired 25K-Gate CMOS Gate Array", IEEE Journal of Solid State Circuit, vol. SC-20, No. 5, Oct. 1985.

Primary Examiner—Andrew J. James
Assistant Examiner—Ngan V. Ngo
Attorney, Agent, or Firm—Burns, Doane, Swecker & Mathis

[57] ABSTRACT

A semiconductor integrated circuit such as a semi-custom LSI includes a semiconductor substrate, a plurality of circuit elements formed on the semiconductor substrate and aligned in a plural number of lines, selected one's of the circuit elements being used in an electrical circuit formed in the semiconductor integrated circuit, unselected one's of the circuit elements being left without used in the electrical circuit, at least one set of capacitor cells formed on but isolated from the unselected one of the circuit element, wirings formed in spaces between the lines of the circuit elements to interconnect the selected ones of the circuit elements, and a means for connecting at least one of the capacitor cells selected in the one set to one of wirings.

7 Claims, 2 Drawing Sheets

SEMI-CUSTOM INTEGRATED CIRCUIT PROVIDED WITH STANDARDIZED CAPACITOR CELLS

This application is a continuation, of application Ser. No. 929,769, filed Nov. 13, 1986.

BACKGROUND OF THE INVENTION

1. Field of the Invention

This invention relates to a semiconductor integrated circuit such as a semi-custom LSI (Large-Scale Integrated Circuit) designed by a gate-array technique or the like, and more particularly to a structure of capacitors formed in the semiconductor integrated circuit.

2. Description of the Related Art

In recent years, has been developed a semi-custom LSI in which a plurality of standard circuit elements are formed in advance on a semiconductor substrate and wirings are thereafter formed on the substrate to form a desired circuit. Since the circuit is obtained only by designing the layout of the wirings on a semiconductor substrate in which circuit elements are formed in a predetermined layout, the semi-custom LSI has some notable features of a short production period and a low manufacturing cost, compared to the conventional standard LSI in which both layouts of circuit elements and wirings are newly designed to form a circuit. The semi-custom LSI's are widely used to form logic circuits. Therefore, the LSI in which a plurality of logic gates are previously formed as the standard circuit elements are called a gate-array. The logic gates are called logic cells.

The gate-array will be further explained. A plurality of logic cells are first formed on a semiconductor substrate aligned in a number of parallel lines. The logic cells are wired to form a circuit with wiring layers disposed on space regions between the lines. In a case where it is necessary to control a timing of logic signal, the timing can be controlled by adding a capacitance to a specific wiring layer to give a time delay. In a course of the invention, the inventor devised a capacitor which is formed by adding an extended region to the wiring layer.

Usually, the wirings between logic cells are made by wiring layers formed on the space regions between the lines of logic gates. If the wiring layers are made of a single layer of wirings, the presence of the extended region apparently restricts a freedom of wiring design. In more practical case, the wiring layers are formed by use of two layers of wirings. A first layer is used for wirings running in a direction perpendicular to the lines of logic cells. A second layer is used for wirings running in parallel with the lines of logic cells. Since the extended region is added to a wiring formed by one of the two layers, the wiring freedom of the wirings used by the one of the two layers is restricted. The locations of interconnections between the wirings of the first layer and the wirings of the second layer are also restricted.

The extended regions are designed as a single region presenting a required capacitance. Therefore, the area of the extended region is individually determined. According to the gate-array technique, the wirings are automatically designed by use of a computer soft-ware. The individual design raises some problems in computer-aided designing (CAD). Additional programming is required to determine the area of the extended region. Furthermore, the extended region is formed in the same region as the wirings. The CAD must be programed to avoid overlapping of the extended region and other wirings.

Capacitances of the capacitors are affected by manufacture errors to change their value. If capacitances having a predetermined relationship are required, some adjustment of layout design is required to compensate the manufacture errors.

SUMMARY OF THE INVENTION

A primary object of the present invention is to provide a semi-custom LSI having capacitors suitable for a wiring design by CAD.

Another object of the present invention is to provide a semi-custom LSI having capacitors, whose capacitances are accurately controlled to a predetermined relationship.

According to the present invention, there is provided a semiconductor integrated circuit comprising a semiconductor substrate, a plurality of circuit elements formed on the semiconductor substrate and aligned in a plurality of parallel lines, wiring layers disposed in a space between the lines of the circuit elements and interconnecting selected one's of the circuit elements, at least one set of at least one capacitor cell disposed on unselected one of the circuit element through an insulator film, and a means for connecting the capacitor cells to the selected one of the circuit elements.

Although one capacitor cell may form the one set, the present invention is more advantageous when two or more capacitor cells form the one set. Capacitance is controlled by numbers of capacitor cells connected by the connecting means.

The capacitor cell according to the present invention is formed on an unselected circuit element and does not occupy an area in the space between the lines of circuit elements. Therefore, the freedom in design of the wiring layers is not restricted by the capacitor cell or cells. The spaces between the lines of circuit elements can be exclusively used for wiring layers. Due to this fact, the wiring layers may be easily designed by a computer soft-ware.

According to the notable feature of the present invention in which two or more capacitor cells form the one set, the capacitance may be selected by changing the number of capacitor cells connected to one of wirings. The change in number of commonly connected capacitor cells is easily achieved by the computer soft-ware. Furthermore, the capacitances obtained by the selection from the capacitor cells keeps a predetermined relationship, irrespective of manufacturing errors. If the capacitors are used for applying time delays to electrical signals, the relationship between the time delayes is kept to a predetermined relationship.

BRIEF DESCRIPTION OF THE DRAWINGS

The above and further objects, features and advantages of the present invention will become more apparent from the following detailed description taken in conjunction with the accompanying drawings, wherein.

Figure 1:
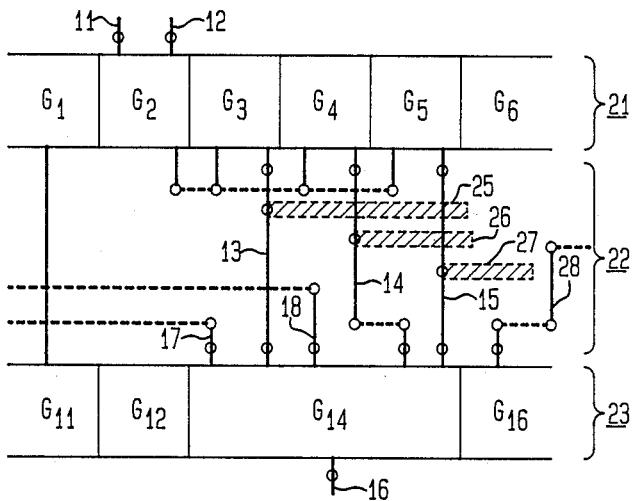
FIG. 1 is a drawing showing a part of wiring layers and cell regions of a semi-custom LSI which is devised by the inventor in the course of the present invention.

When the inventor developed a semi-custom LSI having capacitors for adjusting timings of signals, a semiconductor integrated circuit shown in FIG. 1 was devised. A plurality of logic cells $G_1$ to $G_6$ and $G_{11}$ to $G_{16}$ are formed on a semiconductor substrate. The logic cells $G_1$ to $G_6$ and the logic cells $G_{11}$ to $G_{16}$ are respectively aligned in lines 21 and 23. In an example, the logic cell $G_2$ is a two-input AND gate and the logic cells $G_3$ to $G_5$ are inverters. The logic cell $G_{14}$ is a selector receiving three inputs and deriving one output among the three inputs under a control of two control signals. The logic cells $G_2$ to $G_5$ and $G_{14}$ are used to form a circuit shown in FIG. 3. The logic cells $G_1, G_6$, $G_{11}, G_{12}$ and $G_{16}$ may be any logic gates and are used to form any logic circuit other than the circuit shown in FIG. 3. The circuit in FIG. 3 receives two input 11 and 12 at an AND gate 1, produces three signals 13, 14 and 15 through inverters 2, 3 and 4, applies different time delays to the respective signals 13, 14 and 15 by capacitors 5, 6 and 7, and selects one output 16 among the delayed signal 13, 14 and 15 by a selector 8 under a control of control signals 17 and 18. The reference numbers of signals are referred in the wirings producing the same signals in FIG. 1.

Figure 3:
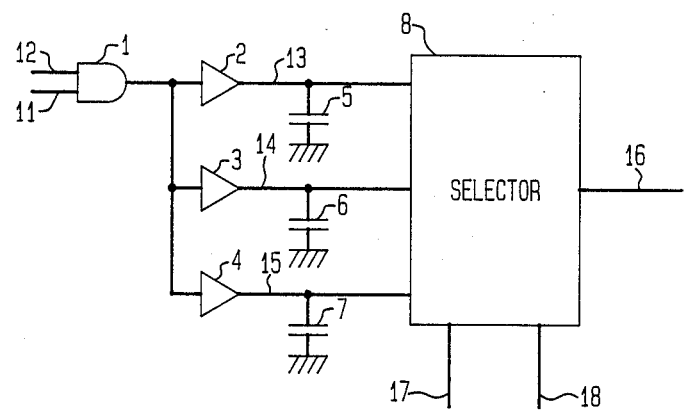
FIG. 3 is a block diagram showing an example of an equivalent circuit embodied in FIGS. 1 and 2.

Turning back to FIG. 1, wiring layers interconnecting the logic cells $G_1$ to $G_6$ and $G_{11}$ to $G_{16}$ are formed in a space 22 between lines 21 and 23 of logic cells. The wiring layers are formed by two layer wirings. The wirings formed in parallel to the lines 21 and 23 and represented by dotted lines are constituted by the lower layer wirings. The wirings in the logic cells are also formed by the lower layer wirings. The wirings formed in perpendicular to the lines 21 and 23 and represented by straight lines are constituted by the upper layer wirings. The interconnections between the lower and upper layer wirings are achieved by conductive through-holes formed in an insulator film between the lower and upper layer wirings. The capacitors 5, 6 and 7 in FIG. 3 are respectively constituted by conductive regions 25, 26 and 27 which are formed in the space 22 between the lines 21 and 23 by the same material as the lower layer wirings at the same time as forming them.

In accordance with the devised structure, the capacitors 5, 6 and 7 are formed by conductive regions 25, 26 and 27 simultaneously made with the lower layer wirings. Furthermore, the conductive regions 25, 26 and 27 require considerable areas. Therefore, the design freedom of the lower layer wirings are widely restricted. One example is the wiring 28. The locations of interconnections between the upper and lower layer wirings must avoid the area of the conductive regions 25, 26 and 27. Thus, the design freedom of the upper layer wirings is also affected from the conductive regions 25, 26 and 27.

The areas of the conductive regions 25, 26 and 27 are determined by the capacitances of the capacitors 5, 6 and 7 and are not controlled by a computer soft-ware for forming wiring patterns. A new process for determining the area of the conductive regions 25, 26 and 27 has to be added to the computer soft-ware. Such computer soft-ware to be added is not simple. Even if the areas of the conductive regions 25, 26 and 27 are designed by the computer soft-ware, some deviation in capacitance due to manufacturing error arises. This deviation changes the relationship in time delay of the signals 13, 14 and 15 from a pre-designed relationship. For adjusting the relationship, some manual repair is necessary for the conductive regions 25, 26 and 27.

DETAILED DESCRIPTION OF THE PREFERRED EMBODIMENT

Figure 2:
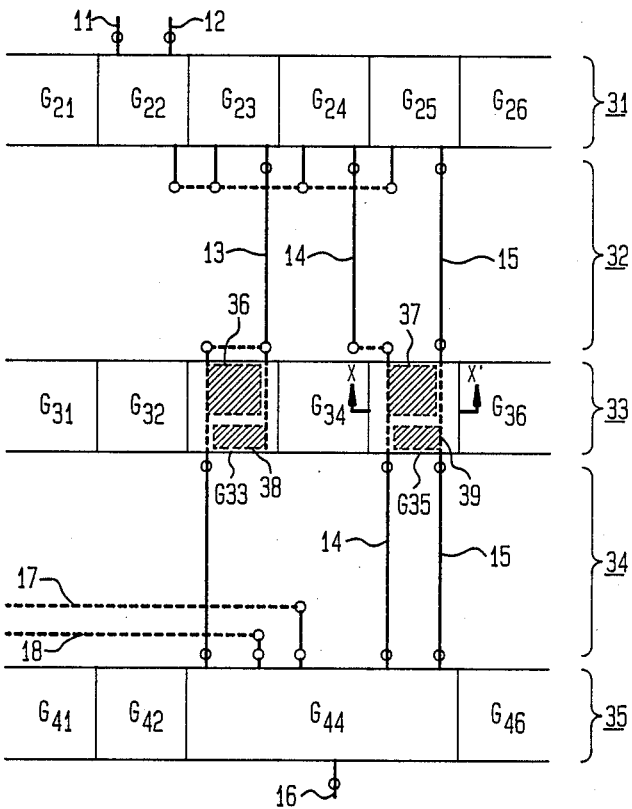
FIG. 2 is a drawing showing a part of wiring layers and cell regions of a semi-custom LSI according to the present invention.

The semi-custom LSI having improved capacitor structure is shown in FIG. 2. A plurality of logic cells $G_{21}$ to $G_{26}$, $G_{31}$ to $G_{36}$ and $G_{41}$ to $G_{46}$ are formed on a semiconductor substrate. The logic cells $G_{21}$ to $G_{26}$ are aligned in a line 31. Similarly, the logic cells $G_{31}$ to $G_{36}$ and the logic cells $G_{41}$ to $G_{46}$ are respectively aligned in lines 33 and 35. Wirings are formed in a spaces 32 between the lines 31 and 33 and a space 34 between the lines 33 and 35. The reference numerals 11 to 18 denote signals explained in connection with FIG. 3. The logic cell $G_{22}$ is an AND gate having two inputs and one output. The logic cells $G_{23}$ to $G_{25}$ are inverters. The logic cell $G_{44}$ is a selector selecting one input signal as an output signal 16 from three input signals 13, 14 and 15 under a control of control signals 17 and 18. The logic cells $G_{22}$ to $G_{25}$ and $G_{44}$ are interconnected by the wirings to achieve the circuit shown in FIG. 3.

The wirings are constituted by two of an upper wiring layer and a lower wiring layer isolated by an insulator film interposed therebetween. The lower wiring layer constitutes wirings running in parallel with the lines 31, 33 and 35 of logic cells, which are represented by dotted lines. The wirings in the logic cells $G_{21}$ to $G_{46}$ are also formed by the lower wiring layer. The upper wiring layer constitutes wirings running perpendicularly to the lines 31, 33 and 35 of logic cells. The wirings of the lower and upper wiring layers are interconnected by conductive through-holes formed in the insulator film. The through-holes are represented by small circles in FIG. 2. The upper and lower wiring layers are formed of aluminum. In place of aluminum, the lower wiring layer may be formed of polycrystalline silicon.

A set of capacitor cells 36 and 38 are formed on a logic cell $G_{33}$. Another set of capacitor cells 37 and 39 are formed on a logic cell $G_{35}$. Both of the logic cells $G_{33}$ and $G_{35}$ are not used in a circuit formed in the semi-custom LSI. The capacitor cells 36 to 39 are formed of the lower wiring layer and the semiconductor substrate. Areas of the capacitor cells 36 and 37 are larger than those of the capacitor cells 38 and 39 to present larger capacitances. The capacitor cells 36 and 38 are commonly connected in parallel to a wiring of the signal 13 to form a capacitor having the largest capacitance value in this embodiment. The capacitor cell 37 is connected to a wiring of the signal 14 to form another capacitor of an intermediate capacitance value. The capacitor cell 39 is connected to a wiring of the signal 15 to form a third capacitor having the lowest capacitance value.

Figure 4:
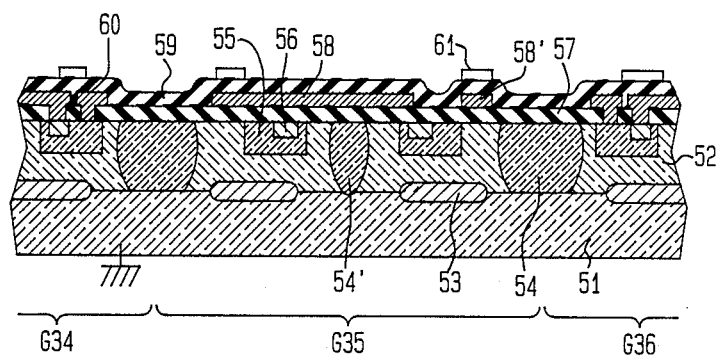
FIG. 4 is a sectional view taken along X—X' of FIG. 2.

The sectional view taken along X—X' of FIG. 2 is shown in FIG. 4. A P-type silicon substrate 51 has $N^+$-type burried regions 53 and an N-type silicon layer 52 is epitaxially grown on the P-silicon substrate 51. $P^+$-isolation regions 54 and 54' are diffused into the N-silicon layer 52 to electrically divide the N-silicon layer 52 into a plurality of N-type island regions. The wide isolation region 54 is formed between the cell regions of the logic cells $G_{34}$ and $G_{35}$ and between the cell regions of the logic cells $G_{35}$ and $G_{36}$. The narrow isolation region 54' is formed to isolate individual element regions in which a bipolar transistor or the like is formed. In the individual element regions, P-base regions 55 and N-emitter regions 56 are consecutively formed. A first insulator film 57 of SiO$_2$ covers the silicon layer 52. Contact holes are opened in the first insulator film 57 on the active cell regions of the logic cells G$_{34}$ and G$_{36}$ which are used to form an electrical circuit in the semi-custom LSI. No contact hole is opened in the first insulator film 57 on the cell region of the logic cell G$_{35}$. Aluminum for the lower wiring layer is deposited over the first insulator film 57 and selectively etched to form inner wirings 60 of the logic cells G$_{34}$ and the like, an upper electrode 58 of a capacitor cell above the non-used cell region G$_{35}$, an inner wiring 58' connected to another capacitor cell electrode, and the wirings (not shown in FIG. 4 but shown by the dotted lines in FIG. 2) running in parallel with the lines 31, 33 and 35 of the logic cells. A portion of the N-silicon layer 52 assigned to the non-used cell G$_{35}$, the P-base regions 55 formed therein, the N-emitter regions 56 and the P+-isolation regions 54 and 54' in the cell G$_{35}$ is electrically floating, not connected anywhere. Since they are in a condition of electrical floating, the capacitor cell electrode 58 forms a capacitor for the capacitor cell 37 together with the P-silicon substrate 51 which is grounded, through a P-N junction or junctions and the insulator 57 therebetween. The equivalent circuit of thus formed capacitor can be expressed as the capacitor 6 in FIG. 3.

A second insulator film 59 is deposited on the whole surface. Contact holes are opened in the second insulator film 59 at the locations of interconnections between the wirings of the lower and upper wiring layers. Aluminum is deposited again on the second insulator film 59 and is subjected to a selective etching process to form wirings of the upper wiring layer running in a direction perpendicular to the lines 31, 33 and 35 of the logic cells.

Turning back to FIG. 2, the capacitor cells 36 and 37 have a dimension of 100 $\mu$m $\times$ 100 $\mu$m and a capacitance of 4 pF. The capacitor cells 38 and 39 have a dimension of 100 $\mu\times$25 $\mu$m and a capacitance of 1 pF. The capacitor cells 36 and 38 are connected to the wiring carrying the signal 13 and give a time delay corresponding to a total capacitance of 4 pF and 1 pF to the signal 13. The capacitor cell 37 is connected to the wiring carrying the signal 14 and gives a time delay corresponding to the capacitance of 4 pF to the signal 14. Similarly, the capacitor cell 39 is connected to the wiring carrying the signal 15 and gives a time delay corresponding to the capacitance of 1 pF to the signal 15.

In this way, the capacitance can be controlled by selecting the capacitor cells or combining the capacitor cells. The selection of capacitor cells or combining the capacitor cells are easily achieved by a computer software. The capacitor cells are not formed in the spaces 32 and 34. The computer soft-ware for determining the wirings is not disturbed by the capacitor cells. The freedom of wirings is not restricted by the capacitor cells. Therefore, the capacitors and the wirings are easily designed by a computer soft-ware.

Furthermore, by selecting the capacitor cells, the capacitors having capacitances in a predetermined relationship can be obtained irrespective of manufacturing errors in photolithographic process and in etching process. The relationship in time delay of the signals 13, 14 and 15 can be accurately determined.

The number of capacitor cells in one set may be arbitraily determined without being limited to two in the above-explained preferred embodiment. The larger is the number of the capacitor cells, the wider is the number of selectable capacitances. The wirings and the capacitor cells may be constituted by a single wiring layer, if there is not any crossing of wirings.

What is claimed is:

1. A semiconductor integrated circuit comprising:
   a semiconductor substrate,
   a plurality of circuit elements including bipolar transistors formed in said semiconductor substrate and aligned in a plural number of lines,
   a first insulating film covering said semiconductor substrate at said lines and at portions between said lines, a plurality of contact holes being formed in said first insulating film for a selected group of bipolar transistors in said lines, said first insulating film having no contact holes on an unselected group of bipolar transistors ins aid lines, and
   a first level of metallic layers disposed on said first insulating film, a first group of said metallic layers running between said lines as at least a part of wirings for interconnection, a second group of said metallic layers being formed on said selected group of bipolar transistors at said lines and being connected to said selected group of bipolar transistors through said contact holes, and a third group of said metallic layers having an enlarged area located on but isolated from said unselected group of bipolar transistors via said first insulating film to form a capacitor in which said enlarged area serves as an upper electrode and said semiconductor substrate with the unselected group of bipolar transistors formed therein serves as a lower electrode without having direct connection to said first level of metallic layers.

2. A semiconductor integrated circuit as claimed in claim 1, wherein said third group of said metallic layers have a plurality of enlarged portions of different areas to form capacitors of different capacitances.

3. A semiconductor integrated circuit as claimed in claim 1, further comprising:
   a second insulating film covering said first level of metallic layers,
   a second level of wiring layers formed on said second insulating film, and
   conductive through-holes formed in said second insulating film and interconnecting said second level of wiring layers and said first level of metallic layers.

4. A semiconductor integrated circuit as claimed in claim 3, wherein said first group of said metallic layers run in parallel with said lines or said circuit elements, said second level of wiring layers running perpendicularly to said lines of said circuit elements.

5. A semiconductor integrated circuit as claimed in claim 1, wherein said selected group of said bipolar transistors forms a logic circuit.

6. A semiconductor integrated circuit comprising:
   a semiconductor substrate,
   a plurality of circuit elements formed on said semiconductor substrate and aligned in a plural number of lines, selected ones of said circuit elements being used to form an electrical circuit, and unselected ones of said circuit elements,
   a first insulating film covering said semiconductor substrate and having first through-holes on said selected circuit elements, said unselected circuit elements being entirely covered with said first insulating film,
   a first metal layer formed on said first insulating film and having a first portion on said semiconductor substrate between said lines of said circuit elements to form first wirings, a second portion formed on but insulating from said unselected ones of said circuit elements to form a plural number of capacitor electrodes and a third portion formed on said lines of said circuit elements to wire said selected circuit elements to said first wirings through said first through-holes, and to wire said capacitor electrodes to said first wirings, a second insulating film covering said first metal layer and having second through-holes, and a second metal layer formed on said second insulating film between said lines of said circuit elements to form second wirings, said second wirings running in a direction perpendicular to a direction in which said first wirings run and having portions overlapping said first wirings, and said first and second wirings being interconnected through said second through-holes at their overlapping portions to form said electrical circuit.

7. A semiconductor integrated circuit as claimed in claim 6, wherein said electrical circuit is a logic gate.

* * * * *